US008273984B2

(12) United States Patent
Combs et al.

(10) Patent No.: US 8,273,984 B2
(45) Date of Patent: Sep. 25, 2012

(54) SECURITY LATCH DEVICE FOR A TRANSFORMER BOX

(76) Inventors: George W. Combs, Goldsboro, NC (US); Borden Franklin Howell, Jr., Goldsboro, NC (US)

(*) Notice: Subject to any disclaimer, the term of this patent is extended or adjusted under 35 U.S.C. 154(b) by 261 days.

(21) Appl. No.: 12/852,541

(22) Filed: Aug. 9, 2010

(65) Prior Publication Data

US 2011/0031013 A1 Feb. 10, 2011

Related U.S. Application Data

(60) Provisional application No. 61/232,138, filed on Aug. 7, 2009.

(51) Int. Cl.

*H01R 13/502* (2006.01)
*H01J 5/00* (2006.01)
*H01J 15/00* (2006.01)
*H05K 5/00* (2006.01)

(52) U.S. Cl. .......................... 174/50; 174/561; 292/285

(58) Field of Classification Search .................... 174/50, 174/561; 292/285

See application file for complete search history.

(56) References Cited

U.S. PATENT DOCUMENTS

| | | | | |
|---|---|---|---|---|
| 4,113,291 A * | 9/1978 | Cameron | 292/40 |
| 5,783,775 A * | 7/1998 | Marusinec | 174/50 |
| 6,053,547 A * | 4/2000 | Lemieux | 292/281 |
| 6,179,350 B1 * | 1/2001 | Ely et al. | 292/113 |
| 6,290,375 B1 * | 9/2001 | LeVasseur | 362/368 |
| 6,315,337 B1 * | 11/2001 | Lewis | 292/285 |
| 6,367,852 B1 * | 4/2002 | Aspenwall | 292/285 |
| 7,324,332 B1 * | 1/2008 | Shelton et al. | 361/634 |
| 7,475,515 B2 * | 1/2009 | Machledt et al. | 52/169.7 |
| 7,569,777 B1 * | 8/2009 | Gillam | 174/562 |
| 7,916,458 B2 * | 3/2011 | Nelson et al. | 361/623 |
| 2003/0102141 A1 * | 6/2003 | Schneider et al. | 174/50 |
| 2011/0192627 A1 * | 8/2011 | Niles et al. | 174/50 |

* cited by examiner

*Primary Examiner* — Hung Ngo
(74) *Attorney, Agent, or Firm* — Olive Law Group, PLLC

(57) ABSTRACT

A security latch device is provided. The device includes a bracket for being attached to a structure and having an outwardly extending flange having a lock pin slot defined therein, a hinged assembly defining a first hinged portion for being attached to the structure and a second hinged portion for being cooperatively engaged with the bracket, the second hinged portion defining a slot for allowing pass-through of the outwardly extending flange of the bracket, and a cup for attaching to the second portion of the hinged assembly and defining a cavity therein and an aperture therethrough that is in general alignment with the lock pin slot of the bracket so that the lock pin is configured for being received in the cavity and extending through the aperture of the cup and the lock pin slot of the bracket for securing the hinged assembly to the bracket.

19 Claims, 5 Drawing Sheets

SECURITY LATCH DEVICE FOR A TRANSFORMER BOX

This application claims priority to U.S. Provisional Patent Application No. 61/232,138 filed on Aug. 7, 2009, the contents of which are hereby incorporated.

BACKGROUND OF THE INVENTION

This invention relates to a latch device, and more particularly towards a universal security latch device for use with an electrical transformer box. Transformers are used to transform the electrical power coming in from power lines to an acceptable voltage for residential or commercial usage. The transformer increases voltage before transmitting electrical energy over long distances through wires. Electrical power wires have an inherent resistance that reduces electrical energy. This energy reduction is multiplied over long distances. By transforming electrical power to a high-voltage form for transmission along the electrical power lines and then back to low voltage electricity at a residential or commercial establishment, transformers enable cost effective transmission of power over long distances.

To protect transformers from exposure to the elements and from tampering by humans, transformers are installed in a transformer box. These transformer boxes enclose the transformer and are typically secured shut by the use at least two fasteners for enhanced security purposes.

These transformer boxes were first installed in the 1970's. Some of these transformer boxes have rusted or have been damaged to the point that they need to be replaced. Typically, the utility provider companies that own the transformers have replaced the transformer and the transformer box when the boxes have become rusted or damaged. This comes at a substantial expense and cost to the power company, and ultimately to their customers as the transformer may have still been functional.

Typically, the rust that occurs in the transformer box occurs at a lowermost portion. This portion may coincide with the location of the security latch device assembly used to secure the transformer box shut. Accordingly, in many instances, the area around the security latch assembly is rusted or rotted away. Replacement of rusted portions of the transformer box is relatively easy with the exception of the portion about the security latch device. If the portion about the security latch assembly is replaced, the latch assembly must usually also be replaced, and this can be difficult due to differing designs, shapes, and configurations of boxes or to the inability to find any replacement security latch device. Additionally, the transformer box may warp due to exposure to the sun and replacement latch assemblies do not feature methods in which to compensate for warping of the box such that replacement latch device assemblies cannot be generally aligned so as to receive a lock.

Accordingly, there is a need for a security latch assembly that is universal in configuration and can be readily installed on a wide variety of transformer boxes.

SUMMARY OF THE INVENTION

Therefore, it is an object of the invention to provide a security latch assembly for use with replacing a rusted portion of a transformer box.

It is another object of the invention to provide a security latch assembly for use with replacing a rusted portion of a transformer box that is universal and adaptable to fit a wide variety of transformer boxes.

It is another object of the invention to provide a security latch assembly for use with replacing a rusted portion of a transformer box that is easily installed.

It is another object of the invention to provide a security latch assembly for use with replacing a rusted portion of a transformer box that is aesthetically pleasing.

It is another object of the invention to provide a security latch assembly for use with replacing a rusted portion of a transformer box that is structurally sound and will provide a useful service life.

These and other objects are achieved by providing a security latch device. The latch device includes a bracket for being attached to a structure and having an outwardly extending flange having a lock pin slot defined therein, a hinged assembly defining a first hinged portion for being attached to the structure and a second hinged portion for being cooperatively engaged with the bracket, the second hinged portion defining a slot for allowing pass-through of the outwardly extending flange of the bracket, and a cup for attaching to the second portion of the hinged assembly and defining a cavity therein and an aperture therethrough that is in general alignment with the lock pin slot of the bracket so that the lock pin is configured for being received in the cavity and extending through the aperture of the cup and the lock pin slot of the bracket for securing the hinged assembly to the bracket.

According to another embodiment of the present invention, the bracket defines an aperture for receiving a fastener passing through an aperture defined in the cup for securing the cup to the bracket.

According to another embodiment of the present invention, the aperture defined in the second hinged portion has a larger diameter than the diameter of the aperture defined in the bracket such that the cup placement may be adjusted about the second hinged portion.

According to another embodiment of the present invention, the second hinged portion pivots about the first hinged portion from a first position to a second position in which the outwardly extending flange passes through the slot of the second hinged portion.

According to another embodiment of the present invention, the bracket further includes a securing nut on a back surface thereof for engaging the fastener.

According to another embodiment of the present invention, the bracket further defines at least two spaced-apart apertures for securing the bracket to the structure.

According to another embodiment of the present invention, the second hinged portion defines an aperture for allowing pass-through of the fastener from the cup to the securing nut.

According to another embodiment of the present invention, the hinged assembly is secured to the structure, and further wherein, the structure is an electrical transformer box.

According to another embodiment of the present invention, the electrical transformer box has a top portion and a bottom base portion, and further wherein, the first hinged portion is attached to the top portion of the electrical transformer box and the bracket is attached to the base portion of the electrical transformer box.

According to another embodiment of the present invention, an electrical transformer box is provided. The box includes a top portion and a bottom portion, wherein the top portion has a first position in which the top portion is generally spaced-apart from the bottom portion and a second position in which the top portion is generally in engagement with the bottom portion. A bracket is attached to one of the bottom portion or the top portion and having an outwardly extending flange having a lock pin slot defined therein. A hinged assembly defines a first hinged portion attached to the other of the top portion or the bottom portion and further defining a second hinged portion for being cooperatively engaged with the bracket, the second hinged portion defining a slot for allowing pass-through of the outwardly extending flange of the bracket. A cup is provided for attaching to the second portion of the hinged assembly and defining a cavity therein and an aperture therethrough that is in general alignment with the lock pin slot of the bracket so that the lock pin is configured for being received in the cavity and extending through the aerture of the cup and the lock pin slot of the bracket for securing the hinged assembly to the bracket.

According to another embodiment of the present invention, a method of installing a security latch device on a structure is provided. The method includes attaching a bracket to a structure, wherein the bracket has an outwardly extending flange having a lock pin slot defined therein, providing a hinged assembly having a first hinged portion and a second hinged portion, wherein the second hinged portion defines a slot for allowing pass-through of the outwardly extending flange of the bracket, attaching the first hinged portion to the structure, and attaching a cup to the second portion of the hinged assembly, wherein the cup defines a cavity therein and an aperture therethrough.

According to another embodiment of the present invention, the method also includes aligning the aperture of the cup with the lock pin slot of the bracket.

According to another embodiment of the present invention, the method also includes inserting a lock pin into the cavity of the cup and through the aperture of the cup and the lock pin slot of the bracket.

BRIEF DESCRIPTION OF THE DRAWINGS

Some of the objects of the invention have been set forth above. Other objects and advantages of the invention will appear as the description of the invention proceeds when taken in conjunction with the following drawings, in which.

DESCRIPTION OF THE PREFERRED EMBODIMENTS AND BEST MODE

Figure 1:
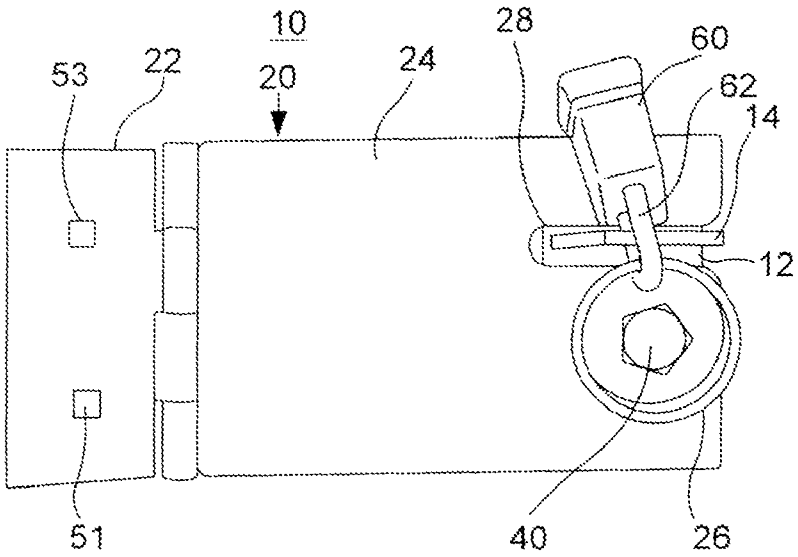
FIG. 1 is a top view of the security latch device including a bracket, a hinged assembly, and a cup according to the present invention.
Figure 2:
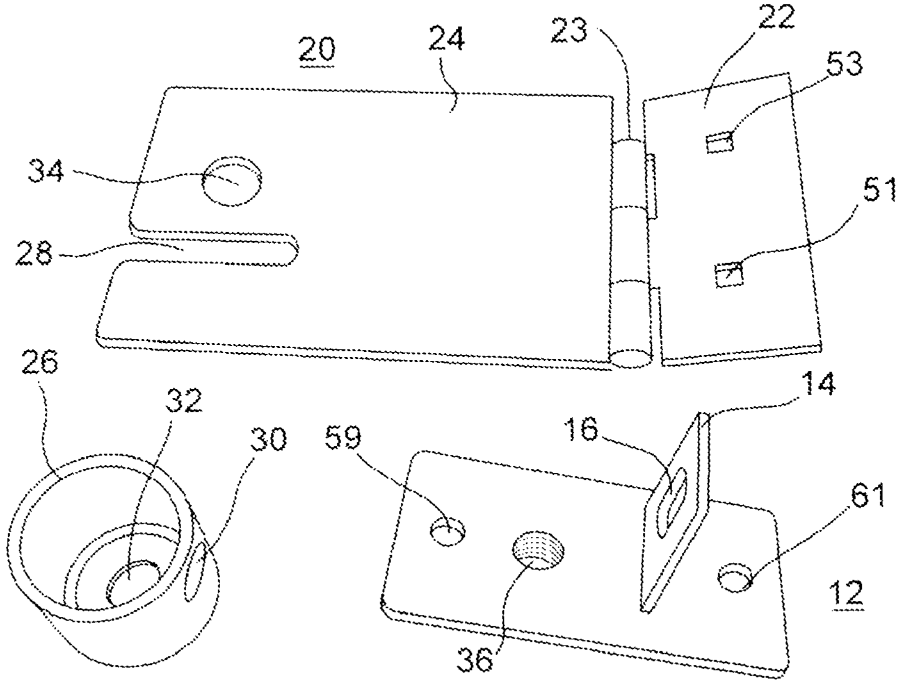
FIG. 2 is a perspective view of the security latch device in a disassembled condition according to the present invention.
Figure 3:
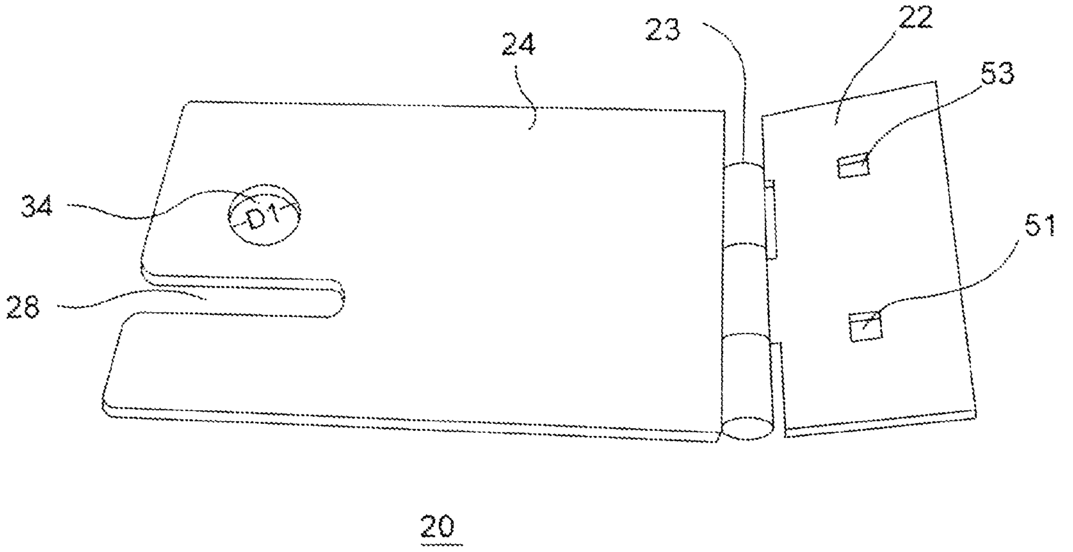
FIG. 3 is a perspective view of the hinged assembly according to the present invention.
Figure 4:
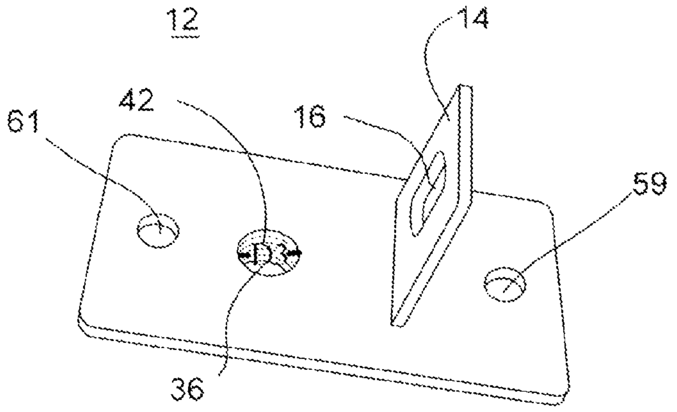
FIG. 4 is a perspective view of the bracket according to the present invention.
Figure 5:
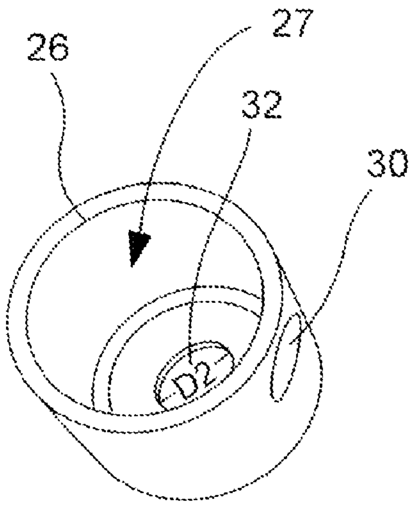
FIG. 5 is a perspective view of the cup according to the present invention.

Referring now specifically to the drawings, a security latch device is shown throughout the Figures and is generally designated 10. With particular relevance to FIG. 1, the security latch device 10 includes a bracket 12 for being attached to a proximally positioned transformer box. The bracket 12 defines an outwardly extending lock flange 14 that also has a lock pin opening 16 defined therein. The security latch device 10 also includes a hinged assembly 20 that defines a first portion 22 for being secured to a transformer lid or top portion. The hinged assembly 20 also includes a second hinged portion 24 that defines a slot 28 for receiving the outwardly extending lock flange 14 of bracket 12. The security latch device 10 also includes a cup 26 that has a lock pin opening 30 defined therein. The cup 26 also defines a cavity 27 therein for receiving a lock pin. The cup 26 is selectively mounted on the second hinged portion 24 by a selectively engageable fastener 40 that passes through openings 32, 34, and 36 defined in each of the cup 26, second hinged portion 24, and the bracket 12, respectively.

The hinged assembly 20 includes a first and second apertures 51, 53 for receiving a fastener for fastening the first portion 22 of the hinged assembly 20 onto the transformer lid. In this manner, the second hinged portion 24 is selectively rotated about hinged joint 23 so that the second hinged portion 24 is rotatable out of the way when the transformer lid is being shut. The presence of the hinged assembly 20 allows for the operator to fully open or close the transformer lid, place the hinged assembly 20 in a rotated away position relative to bracket 12, and then rotate the hinged assembly 20 into alignment with the slot 28 and the flange 14 of bracket 12.

In operation, the hinged assembly 20 is installed on the transformer lid by drilling openings into the transformer lid and then inserting a fastener through apertures 51 and 53 defined in the first portion 22 and into the corresponding openings formed in the transformer lid. This fastener may be a bolt, self threading screw, or any other suitable fastener. The bracket 12 is then installed on the transformer by inserting a fastener through apertures 59 and 61 and into a base portion of the transformer box in a similar manner as discussed with the hinged assembly 20 and apertures 51 and 53. Any necessary repairs to the transformer box should be made before the installation of hinged assembly 20 or bracket 12 such as preparing the finishing surface, removing rust, filling in rotted or removed material, and painting or primering the surface area. The operator may also drill a hole in the transformer box to allow for clearance to the opening 36 and retaining nut 42 to the bracket 12.

Once the bracket 12 and hinged assembly 20 are installed, the transformer lid is closed and the hinged assembly 20 is rotated such that the flange 14 resides within slot 28 of the second portion 24 of the hinged assembly 20. The security latch device 10 is designed such that openings 34 and 36 are generally aligned when this occurs. Next, the operator positions the cup 26 in proximity to openings 34 and 36 such that cup opening 32 is also in general alignment. Opening 34 of the second portion 23 of the hinged assembly 20 is oversized relative to openings 32 and 36 so as to allow some play in aligning openings 32, 34, and 36. Accordingly, diameter D1 of opening 34 is larger than diameter D2 of cap aperture 32 and diameter D3 of bracket aperture 36. In this manner, the operator does not have to drill the various holes in precise locations and this also allows for the operator to compensate for general heat and weather deformation of the transformer box. Fastener 40 is then inserted through openings 32, 34, and then into engagement with securing nut 42, whereby the cup 26, hinged assembly 20, and bracket 12 are then secured together. Fastener 40 is shown as a five sided "pentabolt" fastener head, but may take any appropriate shape. This allows for increased security because only special tools may be used to remove the pentabolt. The fastener has a ½-13 count thread configuration, though other thread configurations may be employed. Once fastener 40 is installed, a lock pin 62 of a lock 60 is inserted through the lock pin slot 16 and the cup opening 30 to thereby provide an additional layer of security by securing the hinged assembly 20 to the bracket 12. The lock may include any suitable type of lock assembly such as pad lock 60 as shown in FIG. 1, or may take on any other suitable form.

Figure 6:
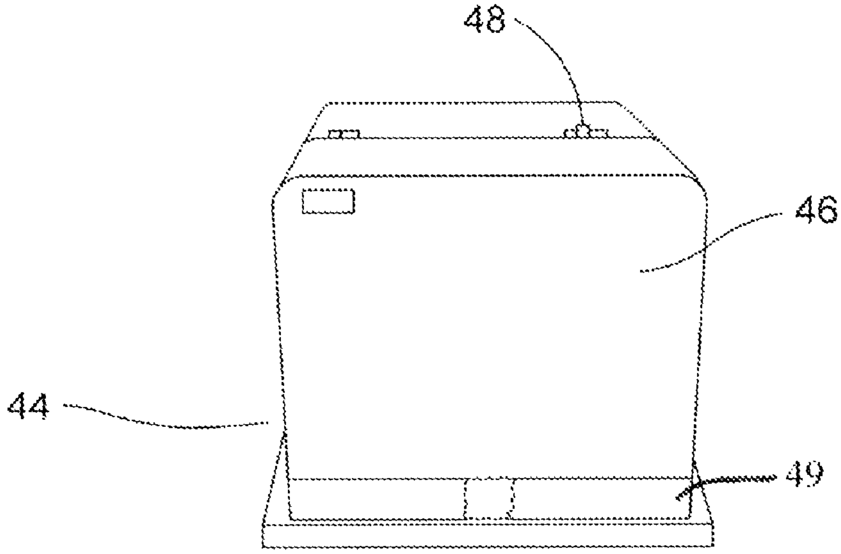
FIG. 6 is a perspective view of a transformer box of the type for use with the present invention.
Figure 7:
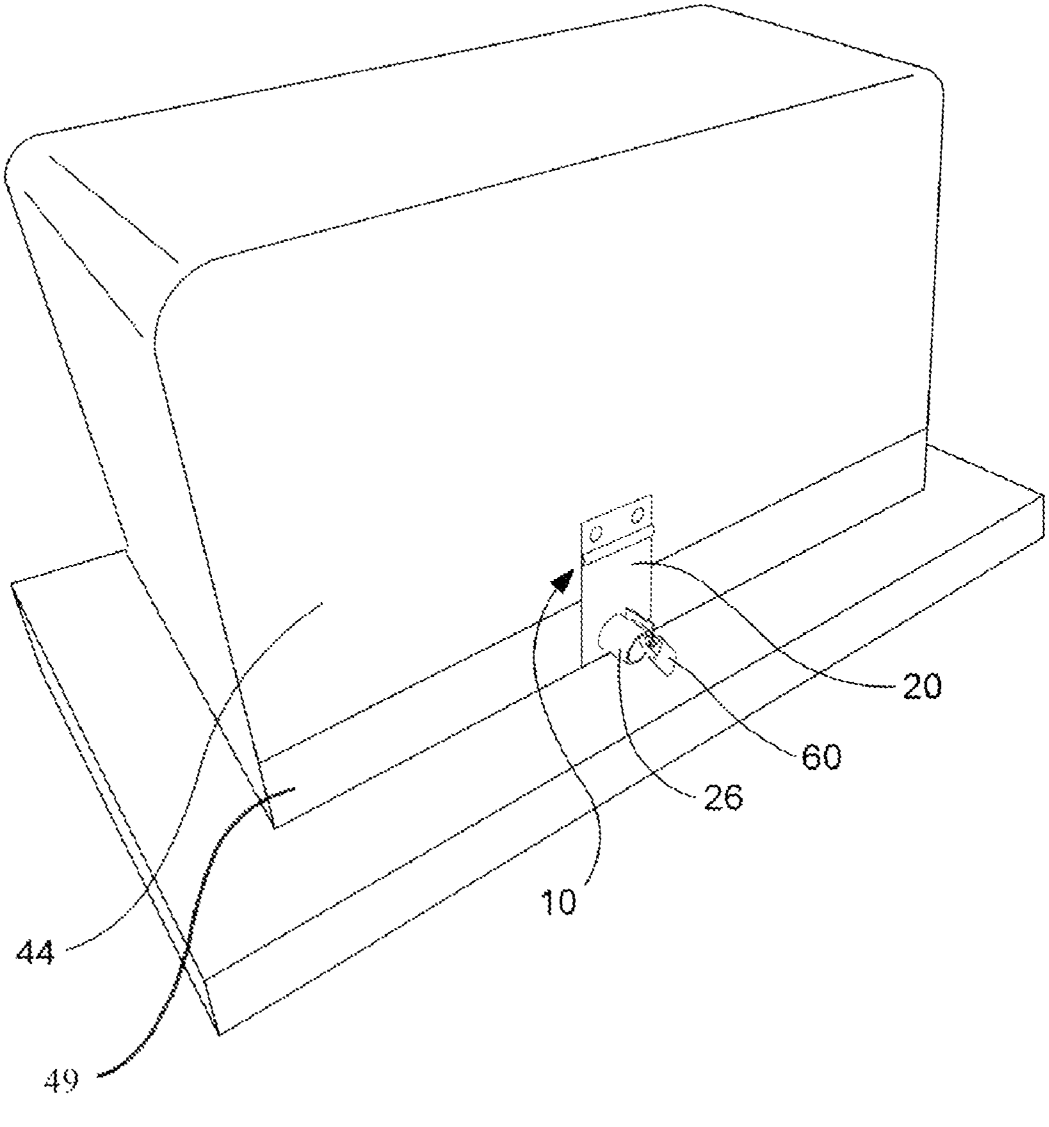
FIG. 7 is a perspective view of the security latch device installed on a transformer box.
Figure 8:
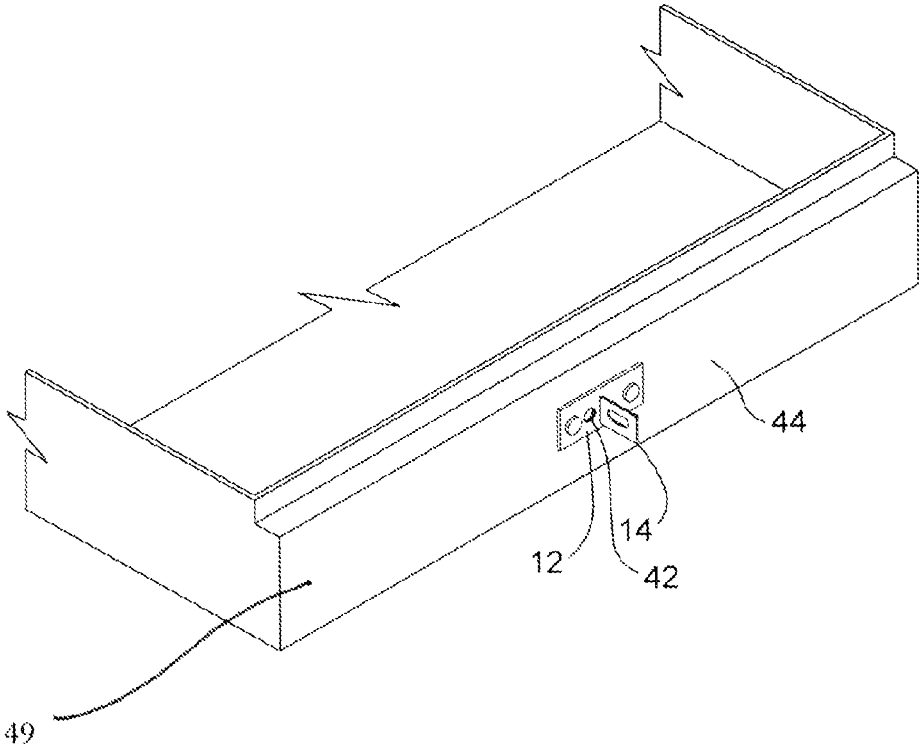
FIG. 8 is a perspective view of the bracket of the security latch device installed on the transformer box of FIG. 7.

A transformer box of the type in need of repairs is shown in FIG. 6 and designated as 44. Transformer lid 46 is open and closeable about hinges 48 to define a closing relationship with base 49 of the transformer box 44. One of the primary benefits of security latch device 10 is that it may be used on transformer boxes of varying designs, such as the transformer box in FIG. 7 that has the security latch device 10 installed thereon. Installation of bracket 12 on the transformer box 44 is shown in detail in FIG. 8.

The security latch device 10 is preferably made of a commercial grade steel, but in other embodiments may be made of aluminum or any other suitable metal, plastic or any other commercially suitable material.

A security latch device is described above. Various details of the invention may be changed without departing from its scope. Furthermore, the foregoing description of the preferred embodiment of the invention and the best mode of practicing the invention are provided for the purpose of illustration only and not for the purpose of limitation.

What is claimed is:

1. A security latch device comprising:
- a bracket for being attached to a structure and having an outwardly extending flange having a lock pin slot defined therein;
- a hinged assembly defining a first hinged portion for being attached to the structure and a second hinged portion for being cooperatively engaged with the bracket, the second hinged portion defining a slot for allowing pass-through of the outwardly extending flange of the bracket; and
- a cup for attaching to the second portion of the hinged assembly and defining a cavity therein and an aperture therethrough in general alignment with the lock pin slot of the bracket so that the lock pin is configured for being received in the cavity and extending through the aperture of the cup and the lock pin slot of the bracket for securing the hinged assembly to the bracket.

2. The security latch device according to claim 1, wherein the bracket defines an aperture for receiving a fastener passing through an aperture defined in the cup for securing the cup to the bracket.

3. The security latch device according to claim 2, wherein the aperture defined in the second hinged portion has a larger diameter than the diameter of the aperture defined in the bracket such that the cup placement may be adjusted about the second hinged portion.

4. The security latch device according to claim 1, wherein the second hinged portion pivots about the first hinged portion from a first position to a second position in which the outwardly extending flange passes through the slot of the second hinged portion.

5. The security latch device according to claim 1, wherein the bracket further includes a securing nut on a back surface thereof for engaging the fastener.

6. The security latch device according to claim 5, wherein the bracket further defines at least two spaced-apart apertures for receiving a fastener for securing the bracket to the structure.

7. The security latch device according to claim 5, wherein the second hinged portion defines an aperture for allowing pass-through of the fastener from the cup to the securing nut.

8. The security latch device according to claim 1, wherein the hinged assembly is secured to the structure, and further wherein, the structure is an electrical transformer box.

9. The security latch device according to claim 8, wherein the electrical transformer box has a top portion and a bottom base portion, and further wherein, the first hinged portion is attached to the top portion of the electrical transformer box and the bracket is attached to the base portion of the electrical transformer box.

10. An electrical transformer box comprising:
- a top portion and a bottom portion, wherein the top portion has a first position in which the top portion is generally spaced-apart from the bottom portion and a second position in which the top portion is generally in engagement with the bottom portion;
- a bracket attached to one of the bottom portion or the top portion and having an outwardly extending flange having a lock pin slot defined therein;
- a hinged assembly defining a first hinged portion attached to the other of the top portion or the bottom portion and further defining a second hinged portion for being cooperatively engaged with the bracket, the second hinged portion defining a slot for allowing pass-through of the outwardly extending flange of the bracket; and
- a cup for attaching to the second portion of the hinged assembly and defining a cavity therein and an aperture therethrough that is in general alignment with the lock pin slot of the bracket so that the lock pin is configured for being received in the cavity and extending through the aperture of the cup and the lock pin slot of the bracket for securing the hinged assembly to the bracket and securing the top portion in the second position.

11. The transformer box according to claim 10, wherein the bracket defines an aperture for receiving a fastener passing through an aperture defined in the cup for securing the cup to the bracket.

12. The transformer box according to claim 11, wherein the aperture defined in the second hinged portion has a larger diameter than the diameter of the aperture defined in the bracket such that the cup placement may be adjusted about the second hinged portion.

13. The transformer box according to claim 10, wherein the second hinged portion pivots about the first hinged portion from a first position to a second position in which the outwardly extending flange passes through the slot of the second hinged portion.

14. The transformer box according to claim 10, wherein the bracket further includes a securing nut on a back surface thereof for engaging the fastener.

15. The transformer box according to claim 14, wherein the bracket further defines at least two spaced-apart apertures for securing the bracket to the structure.

16. The transformer box according to claim 14, wherein the second hinged portion defines an aperture for allowing pass-through of the fastener from the cup to the securing nut.

17. A method of installing a security latch device on a structure, comprising:
- attaching a bracket to a structure, wherein the bracket has an outwardly extending flange having a lock pin slot defined therein;
- providing a hinged assembly having a first hinged portion and a second hinged portion, wherein the second hinged portion defines a slot for allowing pass-through of the outwardly extending flange of the bracket;
- attaching the first hinged portion to the structure; and
- attaching a cup to the second portion of the hinged assembly, wherein the cup defines a cavity therein and an aperture therethrough.

18. The method according to claim 17, further comprising aligning the aperture of the cup with the lock pin slot of the bracket.

19. The method according to claim 18, further comprising inserting a lock pin into the cavity of the cup and through the aperture of the cup and the lock pin slot of the bracket.

* * * * *